(12) United States Patent
Zhang et al.

(10) Patent No.: US 11,533,057 B2
(45) Date of Patent: *Dec. 20, 2022

(54) DYNAMIC MULTIPHASE INJECTION-LOCKED PHASE ROTATOR FOR ELECTRO-OPTICAL TRANSCEIVER

(71) Applicant: Cisco Technology, Inc., San Jose, CA (US)

(72) Inventors: Yudong Zhang, New York, NY (US); Romesh Kumar Nandwana, Breinigsville, PA (US); Kadaba Lakshmikumar, Basking Ridge, NJ (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/333,564

(22) Filed: May 28, 2021

(65) Prior Publication Data

US 2021/0367603 A1 Nov. 25, 2021

Related U.S. Application Data

(63) Continuation of application No. 16/878,069, filed on May 19, 2020, now Pat. No. 11,063,595.

(51) Int. Cl.
*H03L 7/081* (2006.01)
*H04B 1/38* (2015.01)

(52) U.S. Cl.
CPC .............. *H03L 7/081* (2013.01); *H04B 1/38* (2013.01)

(58) Field of Classification Search
None
See application file for complete search history.

(56) References Cited

U.S. PATENT DOCUMENTS

| | | |
|---|---|---|
| 9,009,520 B2 | 4/2015 | Kossel et al. |
| 9,444,438 B2 | 9/2016 | Depaoli et al. |
| 9,654,116 B1 | 5/2017 | Huang |
| 10,135,478 B2 | 11/2018 | Chi et al. |
| 10,476,660 B1 | 11/2019 | Cai et al. |
| 11,063,595 B1 * | 7/2021 | Zhang ........................ H03L 7/24 |
| 2007/0032210 A1 | 2/2007 | Kirschemann et al. |

(Continued)

OTHER PUBLICATIONS

International Search Report and Written Opinion in counterpart International Application No. PCT/US2021/032146, dated Jul. 16, 2021, 18 pages.

(Continued)

*Primary Examiner* — Cassandra F Cox
(74) *Attorney, Agent, or Firm* — Edell, Shapiro & Finnan, LLC

(57) ABSTRACT

Presented herein are methodologies for generating clock signals for transceivers that rely on frequency and phase error correction functions. The methodology includes generating a differential clock signal at a fundamental frequency, generating, based on the differential clock signal and using a multiphase generator, four quadrature signals at the fundamental frequency, supplying the four quadrature signals to an injection-locked phase rotator, and outputting, from the injection-locked phase rotator, a phase adjusted multiphase clock signal based on the four quadrature signals.

20 Claims, 6 Drawing Sheets

(56) References Cited

U.S. PATENT DOCUMENTS

2015/0229298 A1   8/2015   Tomita et al.
2017/0117904 A1   4/2017   Huang

OTHER PUBLICATIONS

Shunli Ma, et al., "A 5-10-Gb/s 12.5-mW Source Synchronous I/O Interface with 3-D Flip Chip Package", IEEE Transactions on Circuits and Systems—I: Regular Papers, vol. 66, No. 2, Feb. 1, 2019, 14 pages.

Enrico Monaco, et al., "A 2-11 GHz 7-Bit High-Linearity Phase Rotator Based on Wideband Injection-Locking Multi-Phase Generation for High-Speed Serial Links in 28-nm CMOS FDSOI", IEEE Journal of Solid-State Circuits, vol. 52, No. 7, Jul. 1, 2017, 14 pages.

Xi Chen, et al.. "Voltage-Follower Coupling Quadrature Oscillator with Embedded Phase-Interpolator in 16nm FinFET", IEEE Custom Integrated Circuits Conference (CICC), Apr. 14, 2019, 4 pages.

P. A. Francese et al., "A 16 Gb/s 3.7 mW /Gb/s 8 tap DFE receiver and baud rate CDR with 31 kppm tracking bandwidth," IEEE J. Solid State Circuits, vol. 49, No. 11, pp. 2490 2502, Nov. 2014.

A. Cevrero , et al. "A 100Gb/s 1.1pJ/b PAM 4 RX with Dual Mode 1 Tap PAM 4 / 3 Tap NRZ Speculative DFE in 14nm CMOS FinFET" ISSCC, pp. 112 114, Feb. 2019.

M. Raj, et al., "A wideband injection locked quadrature clock generation and distribution technique for an energy proportional 16 32 Gb/s optical receiver in 28 nm FDSOI CMOS," IEEE J. Solid State Circuits, vol. 51, No. 10, pp. 2446 2462, Oct. 2016.

E. Monaco, et al., "A 2 11 GHz 7 Bit High Linearity Phase Rotator Based on Wideband Injection Locking Multi Phase Generation for High Speed Serial Links in 28 nm CMOS FDSOI," IEEE JSSC, vol. 52, No. 7, pp. 1739 1752, Jul. 2017.

S. Chen, et al., "A 4 to 16GHz Inverter Based Injection Locked Quadrature Clock Generator with Phase Interpolators for Multi Standard I/ Os in 7nm FinFET" ISSCC, pp. 390 392, Feb. 2018.

Y. Huang, et al. "An 8b Injection Locked Phase Rotator with Dynamic Multiphase Injection for 28/56/112Gb/s Serdes Application" ISSCC, pp. 486 488, Feb. 2019.

* cited by examiner

DYNAMIC MULTIPHASE INJECTION-LOCKED PHASE ROTATOR FOR ELECTRO-OPTICAL TRANSCEIVER

This application is a continuation of U.S. application Ser. No. 16/878,069 filed May 19, 2020, which is incorporated herein by reference in its entirety.

TECHNICAL FIELD

The present disclosure relates to architectures for high speed electrical or optical data transceivers, and specifically to transceivers that operate with sub-rate architectures (e.g., half-rate, quarter-rate, eighth-rate, etc.) and rely on frequency and phase error correction functions.

BACKGROUND

The proliferation of digital devices accessing a network for data-intensive services such as multimedia on-demand, cloud storage, and cloud computing is constantly increasing internet traffic. Data centers, containing hundreds of interconnected servers, switches, and routers, are the heart of the internet network. A typical networking system-on-chip device with high density I/O might include multiple serializer/deserializer (SERDES) interfaces. Preferably, each such SERDES interface should be optimized for speed, as well as for low power consumption, compact silicon area, and reliability.

On a receive side of a typical networking system-on-chip device, a significant amount of power is consumed for clock generation, distribution and synchronization. For example, each receiver might need several phase rotators that are driven by clock-data recovery (CDR) logic, to align the phase of a local clock to sample incoming data at an optimal position in time. Digital phase control is typically achieved by interpolating the phase of quadrature signals with weights set by current digital-to-analog converters. Notably, as bit period decreases and horizontal eye closure happens more quickly as data rates increase, there is an acute need for power efficient phase control with a resolution of only a few degrees and with high linearity.

DESCRIPTION OF EXAMPLE EMBODIMENTS

Overview

Presented herein are methodologies for generating clock signals for transceivers that rely on frequency and phase error correction functions. The methodology includes generating a differential clock signal at a fundamental frequency, generating, based on the differential clock signal and using a multiphase generator, four quadrature signals at the fundamental frequency, supplying the four quadrature signals to an injection-locked phase rotator, and outputting, from the injection-locked phase rotator, a phase adjusted multiphase clock signal based on the four quadrature signals.

An apparatus is also described. The apparatus may include a differential clock signal generator configured to generate a differential clock signal at a fundamental frequency, a multiphase generator configured to generate four quadrature signals at the fundamental frequency based on the differential clock signal, and an injection-locked phase rotator configured to receive the four quadrature signals and to output a phase adjusted multiphase clock signal based on the four quadrature signals.

Example Embodiments

Figure 1:
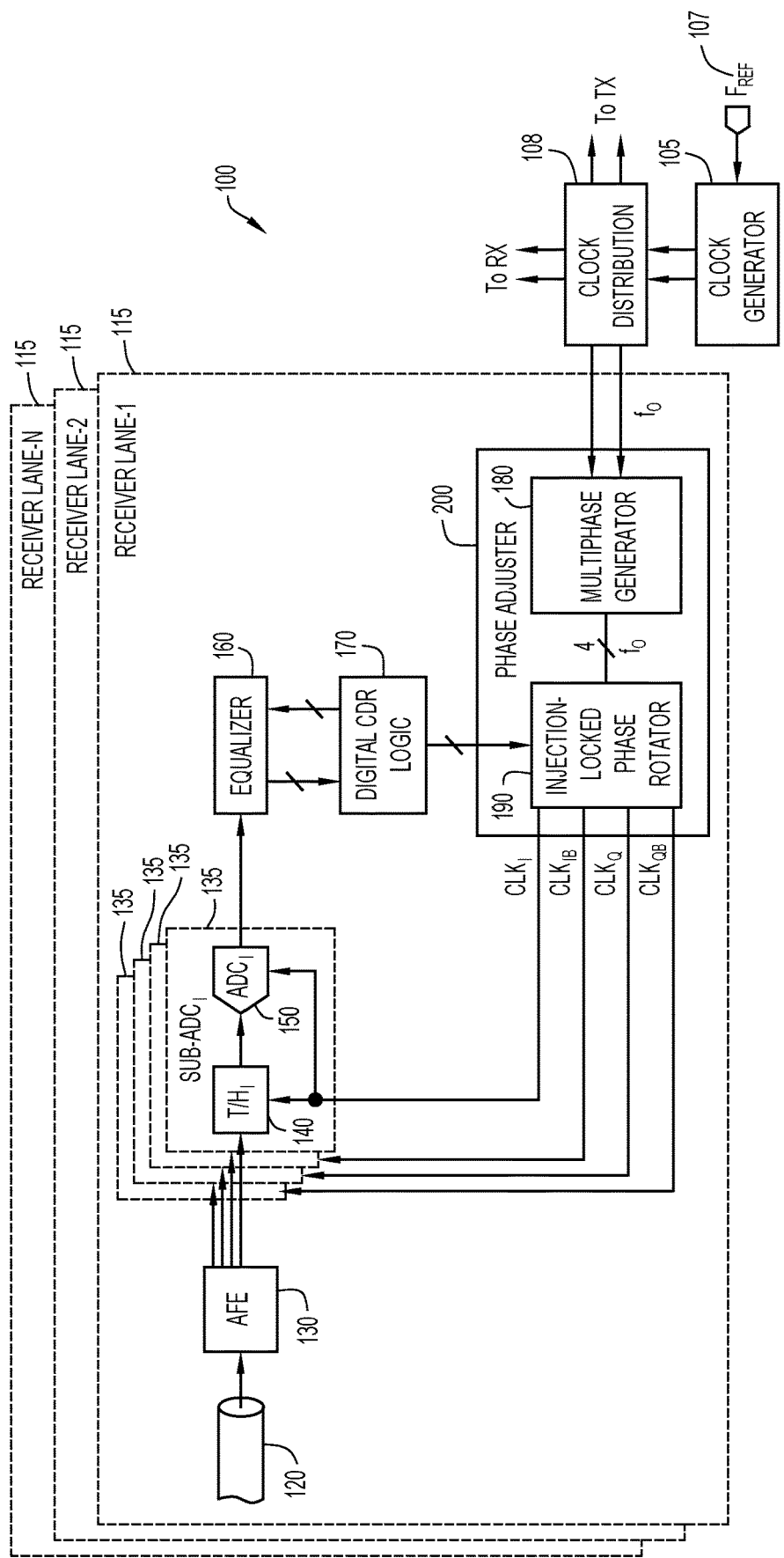
FIG. 1 is a block diagram of a receive side of a transceiver device including a phase adjuster in accordance with an example embodiment.

FIG. 1 is a block diagram of a receive side of a multi-channel (or "lane") transceiver device 100 including a phase adjuster 200 in accordance with an example embodiment. The transceiver device 100 includes multiple receiver lanes 115 (e.g., Receiver Lane-1, Receiver Lane-2, . . . Receiver Lane-N). Each receiver lane 115 is identical and, as such, only the components of Receiver Lane-1 are shown and described. Transceiver device 100 includes a clock generator 105, which may be, e.g., a frequency synthesizer, that receives a frequency reference signal FREF 107, which might be provided by a crystal oscillator. The clock generator 105 supplies a differential clock signal at a fundamental frequency, $f_0$, to a clock distribution module 108 that provides the differential clock signal at $f_0$ to the receiver lanes 115, and in particular to phase adjuster 200. Likewise, the clock generator 105 supplies the same generated differential clock signal at $f_0$ to transmitter portions of the transceiver device 100 (not shown). In general, the clock generator 105 provides a high frequency signal, wherein the frequency is nominally consistent with a sub-data rate of incoming data to be decoded (i.e., half of the data rate, a quarter of the data rate, eighth of the data rate or a sub harmonic of the data rate).

The phase adjuster 200 includes two main function blocks: a multiphase generator 180 and an injection-locked phase rotator 190. The multiphase generator 180 receives the differential clock signal at $f_0$ and generates multiphase (four) clock signals, each 90 degrees apart from each other and still at $f_0$. The four multiphase clock signals are then supplied to the injection-locked phase rotator 190 that generates, in the embodiment shown, four phase corrected multiphase clock signals $CLK_I$, $CLK_{IB}$, $CLK_Q$, $CLK_{QB}$, which may then be passed through a buffer as explained in connection with to FIG. 2. Those skilled in the art will appreciate that an output of the injection-locked phase rotator is not limited to four signals, but may include two, four, eight, etc. signals.

As further shown in FIG. 1, an optical or copper cable 120 supplies an incoming data signal to receiver lane 115. An appropriate analog front end (AFE) 130, e.g., a transimpedance amplifier, continuous time linear equalizer (CTLE), or a variable gain amplifier, receives the incoming signal and generates a corresponding electrical signal that can be further processed by respective sub analog-to-digital converters (ADCs) 135. The sub-ADCs 135 receive the phase aligned multiphase clock signals $CLK_I$, $CLK_{IB}$, $CLK_Q$, $CLK_{QB}$, respectively. More specifically, each of the sub-ADCs may include a track and hold circuit 140 and an ADC 150, each clocked with a respective clock signal $CLK_I$, $CLK_{IB}$, $CLK_Q$, $CLK_{QB}$. The ADC 150 supplies its output to an equalizer 160, such as a feed forward equalizer (FFE), decision feedback equalizer (DFE), a combination of both FFE & DFE, or no equalizer. The output of ADC 150 and the output of equalizer 160 are supplied to digital clock-data recovery logic 170 that supplies a control signal or control word to phase adjuster 200, and specifically to injection-locked phase rotator 190 to cause the injection-locked phase rotator 190 to adjust the phase of the multiphase clock signals $CLK_I$, $CLK_{IB}$, $CLK_Q$, $CLK_{QB}$, to optimally align with the phase of the incoming data signal on optical or copper cable 120 such that the receiver achieves maximum timing margin.

In accordance with an embodiment, multiphase generator 180 may be an injection-locked multiphase generator like that described in M. Raj, et al., "A Wideband injection locked quadrature clock generation and distribution technique for an energy-proportional 16-32 Gb/s optical transceiver in 28 nm FDSOI CMOS," IEEE J. Solid-State Circuits, vol. 51, no. 10, pp 2446-2462, October 2016. In an alternative embodiment, multiphase generator 180 may be a quadrature delay-locked loop (QDLL) as described in A. Cevrero, et al. "A 100 Gb/s 1.1pJ/b PAM-4 RX Dual-Mode 1-Tap PAM-4/3-Tap NRZ Speculative DFE in 14 nm CMOS FinFET" ISSCC, pp 112-114, February 2019. In either case, the multiphase generator 180 is configured to receive an input signal, and output four multiphase clock signals at the fundamental frequency that are then supplied to the injection-locked phase rotator 190.

Figure 2:
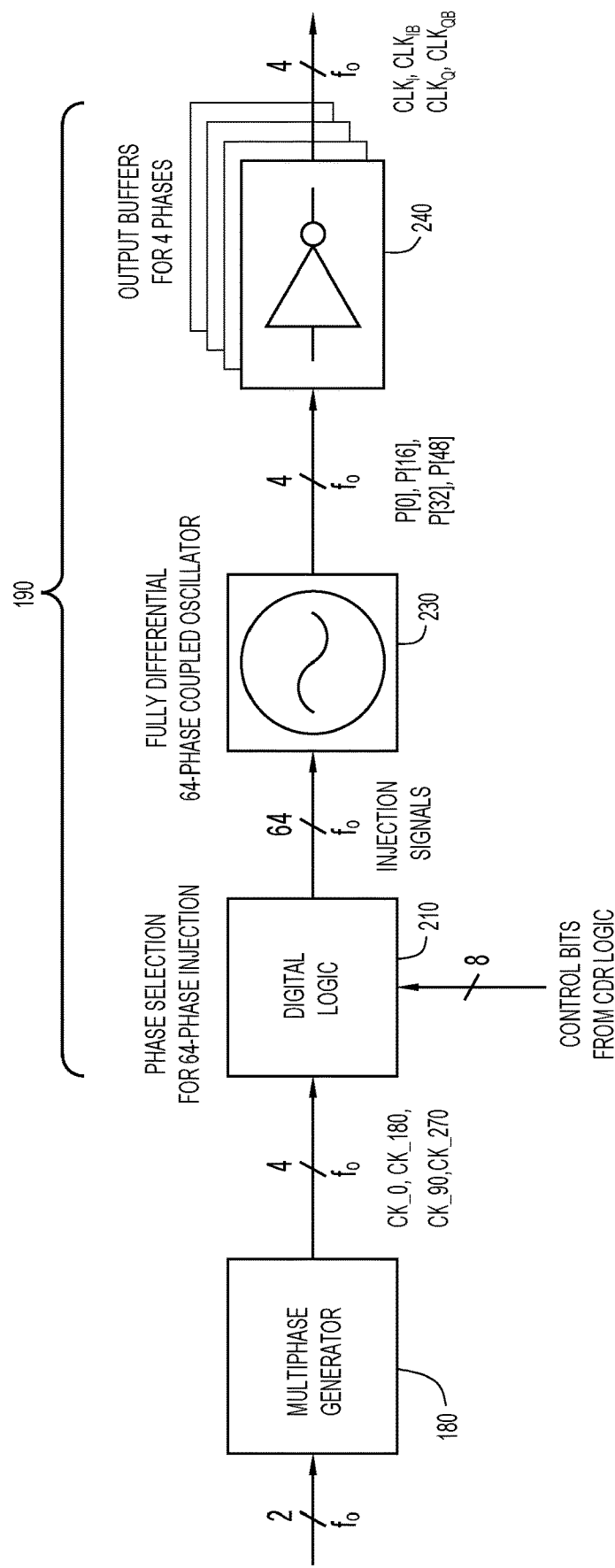
FIG. 2 shows details of an injection-locked phase rotator that is part of the phase adjuster in accordance with an example embodiment.

FIG. 2 shows details of the injection-locked phase rotator 190 that is part of the phase adjuster 200 in accordance with an example embodiment. The injection-locked phase rotator 190 includes digital logic 210, a fully differential 64-phase coupled oscillator 230, and output buffers 240. Digital logic 210 is configured to receive four clock signals CK_0, CK_180, CK_90, CK_270 output by the multiphase generator 180. The digital logic 210 also receives a control word, signal, or bits from digital CDR logic 170 that indicate(s) how the phase of the four clock signals should be adjusted. In response to the control bits, the digital logic 210 outputs, in the depicted embodiment, appropriate injection signals across a 64-bit wide bus to access any of 64 injection sites (shown in FIGS. 3 and 4) in the fully differential 64-phase coupled oscillator 230. More specifically, the digital logic 210 outputs a 64-bit word (corresponding to injection sites) that is supplied to the fully differential 64-phase coupled oscillator 230, which, in response, outputs four phase-corrected or adjusted clock signals $CLK_I$, $CLK_{IB}$, $CLK_Q$, $CLK_{QB}$ (or output clocks from P[0], P[16], P[32], P[48]) that are passed, respectively through output buffers 240, and which may then be supplied, respectively to sub-ADCs 135.

It is noted that using 64 phases provides integer 6-bit phase interpolation resolution. However, with the same 64 phases, additional fine phase resolution can also be achieved using a fractional injection method as described in, e.g., Y. Huang, et al., "An 8b Injection-Locked Phase Rotator with Dynamic Multiphase Injection for 28/56/112 Gb/s Serdes Application," ISSCC, pp. 486-488, February 2019. This improves the resolution from 6-bits to 8-bits in the embodiment described herein. It is also noted that the described embodiment need not be limited to a 64-bit implementation. In another possible embodiment, 128-bit resolution may be implemented.

Figure 3:
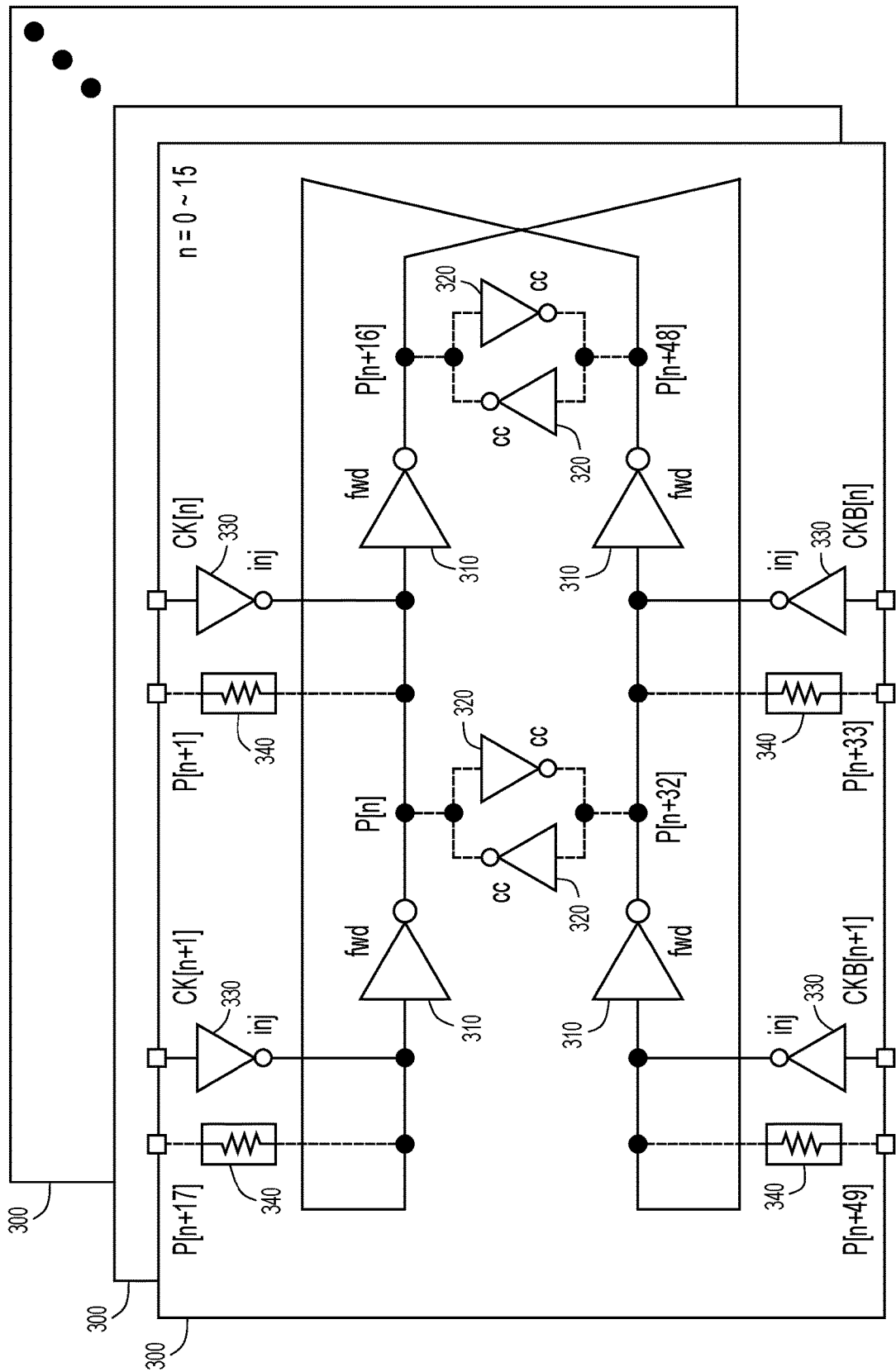
FIG. 3 is a schematic diagram showing components of the injection-locked phase rotator, which is implemented as a plurality of four-phase fully differential cross coupled sub-oscillators in accordance with an example embodiment.

FIG. 3 is a schematic diagram showing components of the injection-locked phase rotator 190, which is implemented, in the embodiment depicted, as 16 four-phase fully differential cross coupled oscillators (sub-oscillator slices 300) in accordance with an example embodiment. These 16 sub-oscillator slices 300 are further coupled using passive coupling elements 340 (e.g., resistive or capacitive) to generate 64 uniformly spaced phases. One sub-oscillator slice 300 of the 16 sub-oscillator slices is shown in detail in FIG. 3. In the depicted embodiment, pairs of series-connected forwarding inverter cells 310 are cross coupled to each other. Further, two pairs of cross-coupled inverters 320 ensure that signals being carried by cross connected branches of the sub-oscillator slice 300 remain as differentiated as possible. Injection inverter 330 respectively receive one of the 64 signals output by digital logic 210 to control or adjust the phase of the clock signals P[0], P[16], P[32], P[48] output of the fully differential 64-phase coupled oscillator 230.

As suggested in the figure, multiple sub-oscillator slices 300 are provided, and, as noted, in one implementation, 16 sub-oscillator slices 300 are provided, resulting in 16 separate two-differential-stage sub-oscillator slices 300 (n=0-15) that provide, together, a resolution of 2 pi/64 for phase control. Each sub-oscillator slice 300, which may be referred to as an "inner ring," determines the oscillating frequency. The connection among the 16 sub-oscillator slices 300, which may be referred to as an "outer ring," defines the phase resolution. The embodiment described herein is an improvement over the prior art approach of, e.g., Huang et al. cited above, which suffers from dependence between the inner rings and outer ring and leads to incorrect phase resolution at higher oscillating frequencies. In contrast, due to the differential nature of the sub-oscillator slices 300, the architecture described herein provides for the independence of each inner ring thus enabling stability at all conditions and preventing false locking.

This topology also allows for frequency error compensation between the receiver lane and the transmitter lane of the incoming data. As the digital CDR logic 170 can select any phase on the output of the injection-locked phase rotator 190 between 0 to 2-pi, by appropriately selecting an injection current location, it is also possible to adjust an output frequency of the injection-locked phase rotator 190 by periodically changing the location of the injection current with the use of digital logic 210. The maximum frequency that can be compensated between a receiver and its corresponding incoming transmitter depends on the rate of control signal change. Frequency correction can be on the order of several hundred parts per million, thus better synchronizing the frequency of operation of the transceiver device 100 with a corresponding transceiver (not shown) connected to the other end of optical or copper cable 120. For example, if the code word output from digital CDR logic 170 goes from 0 to full scale (i.e., 256 for 8-bit control) in time T, and then in the next step comes back to 0, and periodically repeats the cycle, then in this case the frequency that can be compensated is the inverse of period of the code update, i.e., 1/T. The quality of the frequency compensation using this method depends upon the integral non-linearity (INL) of the input digital code change versus the output phase step change.

Additionally, this architecture allows for phase noise filtering of the injection-locked phase rotator 190. As the injection locking strength can be programmed through injection current, it translates into different bandwidths for phase noise filtering of the injection-locked phase rotator 190. The strength of the injection signal is related to the design tradeoff between the jitter of the outputs and the linearity of the injection-locked phase rotator 190, i.e., frequency compensation capability.

Figure 4:
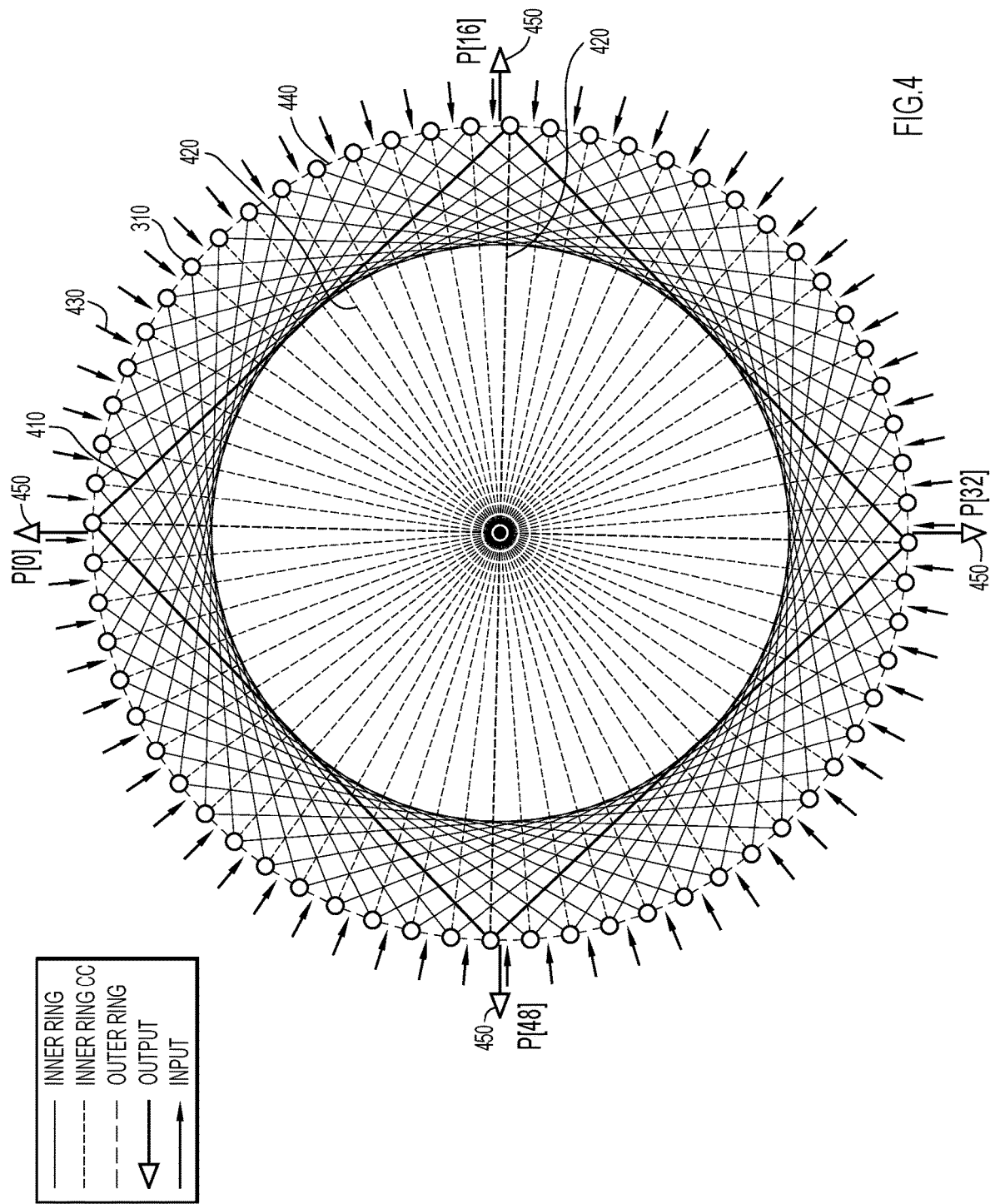
FIG. 4 shows internal connectivity of the injection-locked phase rotator in accordance with an example embodiment.

FIG. 4 shows internal connectivity of the injection-locked phase rotator 190 in accordance with an embodiment. That is, FIG. 4 shows the interconnectedness of the components of 16 sub-oscillator slices 300 of the fully differential 64-phase coupled oscillator 230 shown in FIG. 3. In FIG. 4, forwarding inverter cells 310 (four of which make up each sub-oscillator slice 300) are coupled via an "inner ring" 410. Lines 420 represent the connectivity established by the cross-coupled inverters 320 of each sub-oscillator slice 300, and may be referred to a "cross-coupled inner ring." An "outer ring" depicted by broken line 440 represents how the connectivity provided by passive coupling elements 340, e.g., resistors, capacitors, etc., couple individual forwarding inverters cells 310 to each other. Arrows 430 represent injection sites corresponding to injection inverters 330, of which there are 64 corresponding to the 64 wide connection between digital logic 210 and the fully differential 64-phase couple oscillator, as shown in FIG. 2. Finally, outputs for the four multiphase clock signals $CLK_I$, $CLK_{IB}$, $CLK_Q$, $CLK_{QB}$ may come from four outputs 450 (i.e., output buffers 240 in FIG. 2) driven by any four nodes that are 90 degrees apart from each other, such as those labelled P[0], P[16], P[32], P[48].

Thus, as those skilled in the art will appreciate, the phase control scheme described herein combines the benefits of a multiphase generator (which may be an injection-locked multiphase generator or QDLL, for example) with a dynamic multiphase injection locking (DMIL) technique for phase control. The approach described herein provides a low power solution for global clock generation and distribution for multi-lane receivers. Further, the approach achieves high accuracy and low power for phase rotation correction and frequency error correction.

Figure 5:
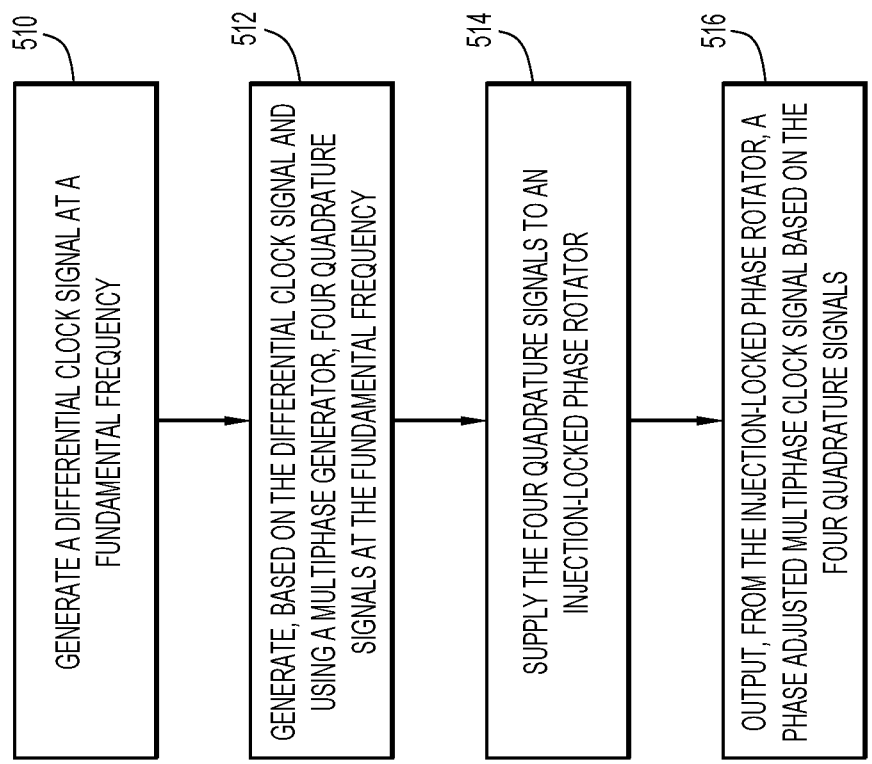
FIG. 5 is a flow chart depicting a series of operations for generating a multiphase clock signal in accordance with an example embodiment.

FIG. 5 is a flow chart depicting a series of operations for generating a multiphase clock signal in accordance with an example embodiment. Phase adjuster logic 202 (depicted in FIG. 6) may be employed to execute the following operations. At 510, an operation is configured to generate a differential clock signal at a fundamental frequency. At 512, an operation is configured to generate, based on the differential clock signal and using a multiphase generator, four quadrature signals at the fundamental frequency. At 514, an operation is configured to supply the four quadrature signals to an injection-locked phase rotator. And, at 516, an operation is configured to output, from the injection-locked phase rotator, a phase-adjusted multiphase clock signal based on the four quadrature signals.

Figure 6:
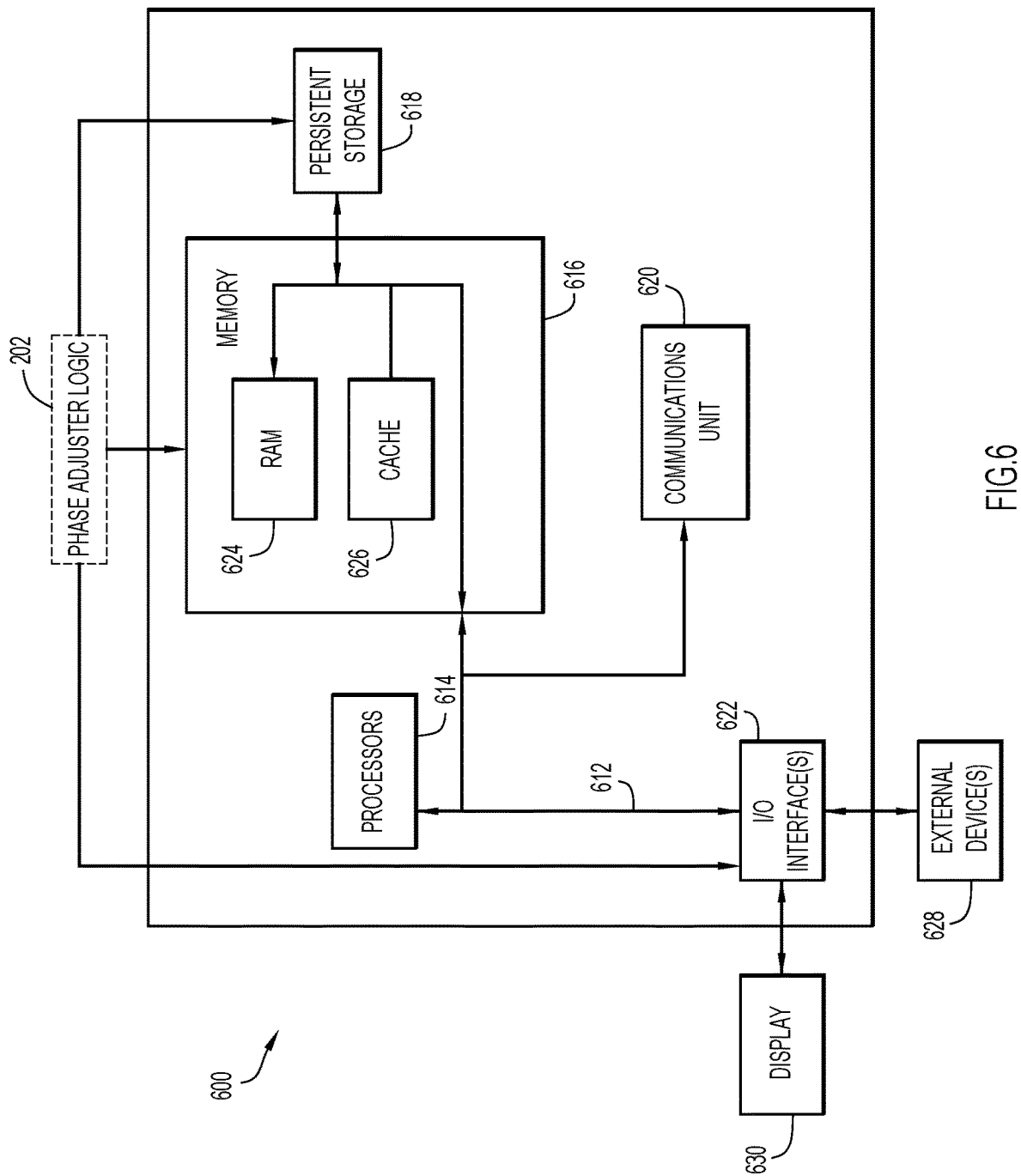
FIG. 6 depicts a device such as a router or switch that includes a transceiver device that executes phase adjuster logic in accordance with an example embodiment.

FIG. 6 depicts a device (e.g., a network device that hosts transceiver device 100) that executes phase adjuster logic 202 to perform the functions described herein in accordance with an example embodiment. It should be appreciated that FIG. 6 provides only an illustration of one embodiment and does not imply any limitations with regard to the environments in which different embodiments may be implemented. In a typical implementation, the device could support back plane communication between processors or long haul optical communication in a data center, where a common crystal or a clock source cannot be shared between the transmitter and receiver. That said, many modifications to the depicted environment may be made. Indeed, in many implementations of a device configured to host transceiver device 100, much of the hardware described below may not be needed.

As depicted, the computer device 600 includes a bus 612, which provides communications between computer processor(s) 614, memory 616, persistent storage 618, communications unit 620, and input/output (I/O) interface(s) 622. Bus 612 can be implemented with any architecture designed for passing data and/or control information between processors (such as microprocessors, communications and network processors, etc.), system memory, peripheral devices, and any other hardware components within a system. For example, bus 612 can be implemented with one or more buses.

Memory 616 and persistent storage 618 are computer readable storage media. In the depicted embodiment, memory 616 includes random access memory (RAM) 624 and cache memory 626. In general, memory 616 can include any suitable volatile or non-volatile computer readable storage media. Instructions for phase adjuster logic 202 as well as, e.g., selecting injection current injection locations for the fully differential 64-phase oscillator 230, may be stored in memory 616 or persistent storage 618 for execution by processor(s) 614 or by I/O interfaces 622 (i.e., where transceiver device 100 might be deployed).

One or more programs may be stored in persistent storage 618 for execution by one or more of the respective computer processors 614 via one or more memories of memory 616. The persistent storage 618 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 618 may also be removable. For example, a removable hard drive may be used for persistent storage 618. Other examples include optical and magnetic disks, thumb drives, and smart cards that are inserted into a drive for transfer onto another computer readable storage medium that is also part of persistent storage 618.

Communications unit 620, in these examples, provides for communications with other data processing systems or devices. In these examples, communications unit 620 includes one or more network interface cards. Communications unit 620 may provide communications through the use of either or both physical and wireless communications links.

interface(s) 622 allows for input and output of data with other devices that may be connected to computer device 600. For example, I/O interface 622 may provide a connection to external devices 628 such as a keyboard, keypad, a touch screen, and/or some other suitable input device, or other computing device, including a switch or router. External devices 628 can also include portable computer readable storage media such as database systems, thumb drives, portable optical or magnetic disks, and memory cards.

Software and data used to practice embodiments can be stored on such portable computer readable storage media and can be loaded onto persistent storage 618 via I/O interface(s) 622. I/O interface(s) 622 may also connect to a display 630. Display 630 provides a mechanism to display data to a user and may be, for example, a computer monitor.

The programs described herein are identified based upon the application for which they are implemented in a specific embodiment. However, it should be appreciated that any particular program nomenclature herein is used merely for convenience, and thus the embodiments should not be limited to use solely in any specific application identified and/or implied by such nomenclature.

Data relating to operations described herein may be stored within any conventional or other data structures (e.g., files, arrays, lists, stacks, queues, records, etc.) and may be stored in any desired storage unit (e.g., database, data or other repositories, queue, etc.). The data transmitted between entities may include any desired format and arrangement, and may include any quantity of any types of fields of any size to store the data. The definition and data model for any datasets may indicate the overall structure in any desired fashion (e.g., computer-related languages, graphical representation, listing, etc.).

The present embodiments may employ any number of any type of user interface (e.g., Graphical User Interface (GUI), command-line, prompt, etc.) for obtaining or providing information (e.g., data relating to scraping network sites), where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, etc.). The interface screens may include any suitable actuators (e.g., links, tabs, etc.) to navigate between the screens in any fashion.

The environment of the present embodiments may include any number of computer or other processing systems (e.g., client or end-user systems, server systems, etc.) and databases or other repositories arranged in any desired fashion, where the present embodiments may be applied to any desired type of computing environment (e.g., cloud computing, client-server, network computing, mainframe, stand-alone systems, etc.). The computer or other processing systems employed by the present embodiments may be implemented by any number of any personal or other type of computer or processing system (e.g., desktop, laptop, PDA, mobile devices, etc.), and may include any commercially available operating system and any combination of commercially available and custom software (e.g., machine learning software, etc.). These systems may include any types of monitors and input devices (e.g., keyboard, mouse, voice recognition, etc.) to enter and/or view information.

It is to be understood that the software of the present embodiments may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control. The computer systems of the present embodiments may alternatively be implemented by any type of hardware and/or other processing circuitry.

Each of the elements described herein may couple to and/or interact with one another through interfaces and/or through any other suitable connection (wired or wireless) that provides a viable pathway for communications. Interconnections, interfaces, and variations thereof discussed herein may be utilized to provide connections among elements in a system and/or may be utilized to provide communications, interactions, operations, etc. among elements that may be directly or indirectly connected in the system. Any combination of interfaces can be provided for elements described herein in order to facilitate operations as discussed for various embodiments described herein.

The various functions of the computer or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, WAN, Intranet, Internet, hardwire, modem connection, wireless, etc.). For example, the functions of the present embodiments may be distributed in any manner among the various end-user/client and server systems, and/or any other intermediary processing devices. The software and/or algorithms described above and illustrated in the flow charts may be modified in any manner that accomplishes the functions described herein. In addition, the functions in the flow charts or description may be performed in any order that accomplishes a desired operation.

The software of the present embodiments may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The communication network may be implemented by any number of any type of communications network (e.g., LAN, WAN, Internet, Intranet, VPN, etc.). The computer or other processing systems of the present embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, Intranet, etc.).

The system may employ any number of any conventional or other databases, data stores or storage structures (e.g., files, databases, data structures, data or other repositories, etc.) to store information. The database system may be implemented by any number of any conventional or other databases, data stores or storage structures (e.g., files, databases, data structures, data or other repositories, etc.) to store information. The database system may be included within or coupled to the server and/or client systems. The database systems and/or storage structures may be remote from or local to the computer or other processing systems, and may store any desired data.

The embodiments presented may be in various forms, such as a system, a method, and/or a computer program product at any possible technical detail level of integration. The computer program product may include a computer readable storage medium (or media) having computer readable program instructions thereon for causing a processor to carry out aspects of presented herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects presented herein.

Aspects of the present embodiments are described herein with reference to flowchart illustrations and/or block diagrams of methods, apparatus (systems), and computer program products according to the embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In summary, in one form, a method is provided. The method includes generating a differential clock signal at a fundamental frequency; generating, based on the differential clock signal and using a multiphase generator, four quadrature signals at the fundamental frequency; supplying the four quadrature signals to an injection-locked phase rotator; and outputting, from the injection-locked phase rotator, a phase adjusted multiphase clock signal based on the four quadrature signals.

The method may also include setting the fundamental frequency to a sub-rate of a data rate of data to be decoded, wherein the sub-rate is one of a half-rate, a quarter-rate, or an eighth-rate.

In accordance with an embodiment, the multiphase generator is one of an injection-locked multiphase generator or a quadrature delay-locked loop.

In a given implementation, the phase adjusted multiphase clock signal comprises one of 2, 4 or 8 phases.

The method may further include supplying the multiphase clock signal to analog-to-digital converters, respectively.

And the method may also include adjusting a frequency of the multiphase clock signal using the injection-locked phase rotator.

In one implementation, the injection-locked phase rotator is a fully differential coupled oscillator, and the fully differential coupled oscillator includes a predetermined number of sub-oscillator slices.

In an embodiment, each sub-oscillator slice includes two pairs of series-connected cross-coupled forwarding inverters.

In an embodiment, each sub-oscillator slice comprises current injection inverters respectively connected to inputs of the series-connected cross-coupled forwarding inverters The method may further include generating, with clock-data recovery logic, a control word and supplying the control word to the injection-locked phase rotator to adjust a phase of the multiphase clock signal.

The method may also include applying fractional injection to the injection-locked phase rotator to achieve additional fine phase resolution.

In another form, an apparatus may also be provided in accordance with an embodiment. The apparatus may include a differential clock signal generator configured to generate a differential clock signal at a fundamental frequency; a multiphase generator configured to generate four quadrature signals at the fundamental frequency based on the differential clock signal; and an injection-locked phase rotator configured to receive the four quadrature signals and to output a phase adjusted multiphase clock signal based on the four quadrature signals.

In an embodiment, the fundamental frequency is set to a sub-rate of a data rate of data to be decoded, wherein the sub-rate is one of a half-rate, a quarter-rate, or an eighth-rate.

In an embodiment, the multiphase generator is one of an injection-locked multiphase generator or a quadrature delay-locked loop.

In an embodiment, the phase adjusted multiphase clock signal comprises one of 2, 4 or 8 phases.

In an embodiment, the injection-locked phase rotator is a fully differential coupled oscillator.

In one implementation, the fully differential coupled oscillator comprises a predetermined number of sub-oscillator slices.

In an implementation, each sub-oscillator slice comprises two pairs of series-connected cross-coupled forwarding inverters.

In still another form, a non-transitory computer readable storage media is provided that is encoded with instructions that, when executed by a processor, cause the processor generate a differential clock signal at a fundamental frequency; generate, based on the differential clock signal and using a multiphase generator, four quadrature signals at the fundamental frequency; supply the four quadrature signals to an injection-locked phase rotator; and output, from the injection-locked phase rotator, a phase adjusted multiphase clock signal based on the four quadrature signals.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   receiving four quadrature signals at a fundamental frequency;
   supplying the four quadrature signals at the fundamental frequency to a fully differential coupled oscillator comprising a predetermined number of sub-oscillator slices, wherein each sub-oscillator slice comprises two pairs of series-connected cross-coupled forwarding inverters;
   adjusting a phase of the four quadrature signals at the fundamental frequency by respectively applying the four quadrature signals at the fundamental frequency to current injection inverters connected to inputs of the two pairs of series-connected cross-coupled forwarding inverters; and
   outputting phase adjusted multiphase clock signals based on the four quadrature signals at the fundamental frequency.

2. The method of claim 1, further comprising adjusting a frequency of the four quadrature signals at the fundamental frequency.

3. The method of claim 1, wherein the fully differential coupled oscillator comprises sixteen sub-oscillator slices.

4. The method of claim 3, wherein the fully differential coupled oscillator comprises 64 current injection inverters.

5. The method of claim 1, further comprising supplying the phase adjusted multiphase clock signals to a multilane transceiver.

6. The method of claim 5, further comprising supplying the phase adjusted multiphase clock signals to respective analog to digital converters of the multilane transceiver.

7. The method of claim 1, further comprising receiving a control word and applying the four quadrature signals at the fundamental frequency to the current injection inverters based on the control word.

8. The method of claim 7, further comprising generating the control word based on feedback received from a multilane optical receiver.

9. The method of claim 8, wherein the feedback received from the multilane optical receiver is received from an equalizer of the multilane optical receiver.

10. The method of claim 1, further comprising buffering the phase adjusted multiphase clock signals.

11. An apparatus comprising:
    a fully differential coupled oscillator comprising a predetermined number of sub-oscillator slices, wherein each sub-oscillator slice comprises two pairs of series-connected cross-coupled forwarding inverters; and
    current injection inverters respectively connected to inputs of the two pairs of series-connected cross-coupled forwarding inverters.

12. The apparatus of claim 11, further configured to apply four quadrature signals at a fundamental frequency to selected ones of the current injection inverters to adjust a phase of the four quadrature signals at the fundamental frequency.

13. The apparatus of claim 12, wherein phase adjusted multiphase clock signals are output based on the four quadrature signals at the fundamental frequency.

14. The apparatus of claim 13, further configured to supply the phase adjusted multiphase clock signals to a multilane transceiver.

15. The apparatus of claim 14, further configured to supply the phase adjusted multiphase clock signals to respective analog to digital converters of the multilane transceiver.

16. An apparatus comprising:
a first pair of forwarding inverters;
a second pair of forwarding inverters connected in series with the first pair of forwarding inverters; and
two pairs of oppositely-oriented cross-coupling inverters respectively connecting outputs of the first pair of forwarding inverters to outputs of the second pair of forwarding inverters.

17. The apparatus of claim 16, further comprising current injection inverters respectively connected to inputs of the first pair of forwarding inverters and to inputs of the second pair of forwarding inverters.

18. The apparatus of claim 17, further configured to apply four quadrature signals at a fundamental frequency to selected ones of the current injection inverters to adjust a phase of the four quadrature signals at the fundamental frequency.

19. The apparatus of claim 18, wherein phase adjusted multiphase clock signals are output based on the four quadrature signals at the fundamental frequency.

20. The apparatus of claim 19, further configured to supply the phase adjusted multiphase clock signals to a multilane transceiver.

\* \* \* \* \*